(12) United States Patent
Yeh et al.

(10) Patent No.: US 11,374,018 B2
(45) Date of Patent: Jun. 28, 2022

(54) SEMICONDUCTOR STRUCTURE

(71) Applicant: MACRONIX INTERNATIONAL CO., LTD., Hsinchu (TW)

(72) Inventors: Teng-Hao Yeh, Zhubei (TW); Hang-Ting Lue, Hsinchu (TW); Chih-Wei Hu, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 60 days.

(21) Appl. No.: 16/931,598

(22) Filed: Jul. 17, 2020

(65) Prior Publication Data
US 2022/0020761 A1    Jan. 20, 2022

(51) Int. Cl.
| H01L 27/11573 | (2017.01) |
| H01L 27/11524 | (2017.01) |
| H01L 27/11556 | (2017.01) |
| H01L 23/522 | (2006.01) |
| H01L 27/1157 | (2017.01) |
| H01L 27/11582 | (2017.01) |
| H01L 23/528 | (2006.01) |
| H01L 27/11529 | (2017.01) |

(52) U.S. Cl.
CPC .... *H01L 27/11573* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| 9,171,859 | B2 | 10/2015 | Oh et al. | |
| 9,768,234 | B2 * | 9/2017 | Jo | H01L 45/085 |
| 10,453,896 | B1 * | 10/2019 | Nazarian | H01L 45/1675 |
| 10,651,187 | B2 | 5/2020 | Liu | |
| 10,930,663 | B2 | 2/2021 | Lu et al. | |
| 2021/0091083 | A1 * | 3/2021 | Kato | H01L 27/1255 |
| 2021/0288058 | A1 * | 9/2021 | Nishimura | H01L 27/11565 |

FOREIGN PATENT DOCUMENTS

| TW | 201530738 A | 8/2015 |
| TW | 201834207 A | 9/2018 |
| TW | 202011578 A | 3/2020 |

OTHER PUBLICATIONS

TW Office Action dated Aug. 5, 2021 in Taiwan application (No. 109124186).

* cited by examiner

*Primary Examiner* — Hsien Ming Lee
(74) *Attorney, Agent, or Firm* — McClure, Qualey & Rodack, LLP

(57) ABSTRACT

A semiconductor structure includes a stack of memory cells and a CMOS structure. The CMOS structure is located below the stack of memory cells. The CMOS structure includes a source line transistor and a bit line transistor.

19 Claims, 9 Drawing Sheets

SEMICONDUCTOR STRUCTURE

BACKGROUND OF THE INVENTION

Field of the Invention

The invention relates in general to a semiconductor structure, and more particularly to a three dimensional semiconductor structure.

Description of the Related Art

With the development of semiconductor technology, various semiconductor elements are provided. The semiconductor elements can be installed to realize varied electric performance. Semiconductor elements are widely used in electronic products.

Under the trends of lightweight, thin, short and small, how to reduce the volume of the semiconductor element or enhance the chip performance at a fixed volume becomes an important target in the semiconductor industries.

SUMMARY OF THE INVENTION

The present invention relates to a semiconductor structure. By disposing a CMOS structure (Complementary Metal Oxide Semiconductor structure) (including a staircase decoder) below a stack of memory cells, the present application has advantages of effectively reducing a size of the memory device, reducing the manufacturing cost and thereby enhancing the chip performance. Furthermore, since local bit lines and local source lines may be arranged alternately and respectively connected to bit line transistors and source line transistors, the present application can achieve the technical effect of reducing the RC delay time of local bit lines and local source lines.

According to an aspect of the present invention, a semiconductor structure is provided. The semiconductor structure comprises a stack of memory cells and a CMOS structure. The CMOS structure is located below the stack of memory cells. The CMOS structure comprises a source line transistor and a bit line transistor.

The above and other aspects of the invention will become better understood with regard to the following detailed description of the preferred but non-limiting embodiment(s). The following description is made with reference to the accompanying drawings.

DETAILED DESCRIPTION OF THE INVENTION

In the following detailed description, for ease of explanation, various specific details are provided to understand the embodiments of the present disclosure as a whole. It should be understood; however; that one or more embodiments can be implemented without employing these specific details. In other cases, in order to simplify the drawings, known structures and components are represented by schematic diagrams.

Besides, the ordinal numbers, such as "the first", "the second", and "the third", are used in the specification and the claims for modifying claim elements only, neither implying nor indicating that the claim elements have any previous ordinal numbers. The ordinal numbers do not indicate the sequence between one claim element and another claim element or the sequence in the manufacturing method. The ordinal numbers are used for clearly differentiating two claim elements having the same designation.

First Embodiment

Figure 1A:
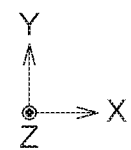
FIG. 1A illustrates a partial top view of a semiconductor structure according to a first embodiment of the present invention.
Figure 1A:
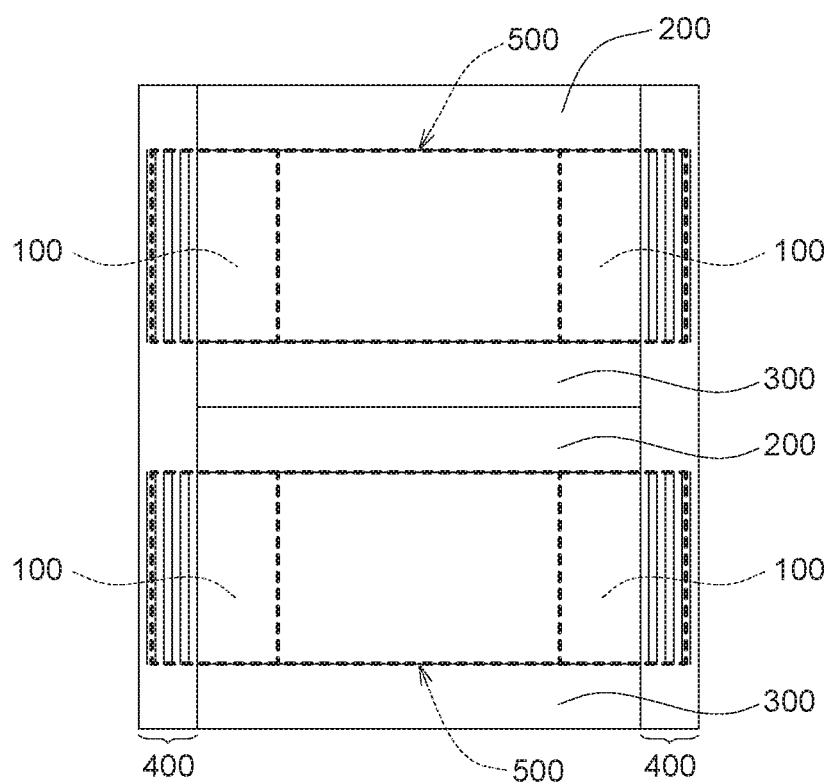
Figure 1B:
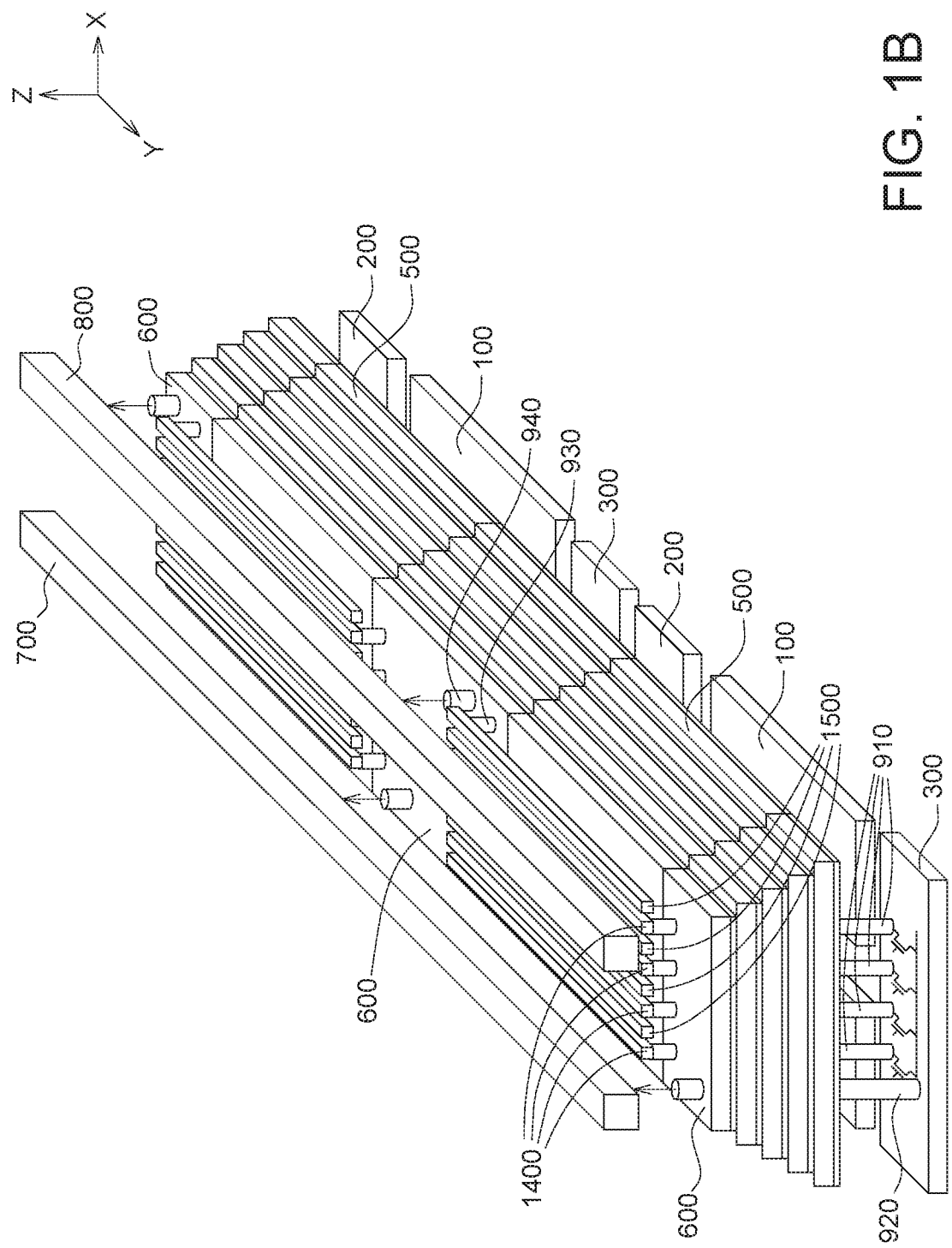
FIG. 1B illustrates a three dimensional view of a semiconductor structure of FIG. 1A.

FIG. 1A illustrates a partial top view of a semiconductor structure 10 according to a first embodiment of the present invention. FIG. 1B illustrates a three dimensional view of a semiconductor structure 10 of FIG. 1A.

Referring to FIGS. 1A and 1B together, semiconductor structure 10 comprises a CMOS structure (Complementary Metal Oxide Semiconductor structure) (comprising a source line transistor 200, a bit line transistor 300 and a staircase decoder 100), a stack of memory cells 500 and an insulating stack 600.

In one embodiment, the CMOS structure is below the stack of memory cells 500. In a longitudinal direction (such as a Z direction), the stack of memory cells 500 overlaps a portion of the CMOS structure and separates from another portion of the CMOS structure.

In one embodiment, the source line transistor 200 and the bit line transistor 300 are disposed at two opposite sides of the stack of memory cells 500. In other words, in a longitudinal direction (such as a Z direction), the stack of memory cells 500 does not overlap the source line transistor 200 and the bit line transistor 300. The source line transistor 200 and the bit line transistor 300 may extend along a X direction. For instance, the source line transistor 200 and the bit line transistor 300 may be a back-to-back MOSFET transistor, but the present invention is not limited thereto.

In one embodiment, the staircase decoder 100 is below the stack of memory cells 500. That is, in a longitudinal direction (such as a Z direction), the staircase decoder 100 at least partially overlaps the stack of memory cells 500. Generally speaking, compared with other elements in the CMOS structure, the staircase decoder 100 occupies more space.

Accordingly, by disposing the staircase decoder 100 below the stack of memory cells 500, the present application has advantages of manufacturing the semiconductor structure 10 of a small size. In addition, the stack of memory cells 500 may comprise array blocks. Multiple array blocks may constitute an array tile. Each of the array tiles may comprise a staircase decoder 100 underneath. Each of the array tiles may independently operate and control each of the array blocks. Each of the array blocks is a smaller unit and has reduced RC delay time, which achieves high speed operation accordingly.

Compared with the comparative example in which a CMOS structure is located at one side of a stack of memory cells and not located below the stack of memory cells, the CMOS structure is below the stack of memory cells 500 in the semiconductor structure 10 of the present invention, which effectively reduces a size of the memory device, reduces the manufacturing cost and thereby enhances the chip performance.

In one embodiment, an insulating stack 600 is located above the source line transistor 200 and the bit line transistor 300. In other words, in a longitudinal direction (such as a Z direction), the source line transistor 200 and the bit line transistor 300 at least partially overlaps the insulating stack 600.

In one embodiment, the stack of memory cells 500 may comprise conductive layers and insulating layers which are alternately stacked. The stack of memory cells 500 is, for example, a 3D-AND type memory array, but the present invention is not limited thereto.

In one embodiment, the stack of memory cells 500 comprises a staircase region 400, In a longitudinal direction (such as a Z direction), the staircase decoder 100 at least partially overlaps the staircase region 400.

Referring to FIG. 1B, the semiconductor structure 10 may further comprise a global bit line 700, a global source line (also referred to as common source line) 800, a first pillar element 910, a second pillar element 920, a third pillar element 930, a fourth pillar element 940, a local bit line 1400 and a local source line 1500.

In one embodiment, the insulating stack 600 is adjacent to the stack of memory cells 500. The insulating stack 600 and the stack of memory cells 500 may be arranged alternately, but the present invention is not limited thereto. For instance, the stack of memory cells 500 and the insulating stack 600 may arranged along a Y direction.

In one embodiment, the insulating stack 600 may comprise two kinds of dielectric layers which are alternately stacked, such as an oxide layer and a nitride layer. For instance, the insulating stack 600 may comprise $SiO_2$ layer and $Si_3N_4$ layer which are alternately stacked, but the present invention is not limited thereto.

In one embodiment, the local bit lines 1400 and the local source lines 1500 are located above the stack of memory cells 500 and the insulating stack 600. The local bit lines 1400 and the local source lines 1500 are electrically connected to a source or a drain of a memory cell string in the stack of memory cells 500, respectively. An extending direction of the local bit lines 1400 and the local source lines 1500 may be parallel to an extending direction of the stacks of memory cells 500 and the insulating stacks 600. The local bit lines 1400 and the local source lines 1500 extend along a Y direction. For instance, the local bit lines 1400 and the local source lines 1500 may be arranged alternately, but the present invention is not limited thereto. The local bit lines 1400 and the local source lines 1500 may comprise a suitable conductive material, such as copper (Cu) or tungsten (W).

In one embodiment, the global bit line 700 and the global source line 800 are located above the stacks of memory cells 500 and the insulating stacks 600. For instance, the global bit line 700 and the global source line 800 may be located above the local bit lines 1400 and the local source lines 1500. An extending direction of the global bit line 700 and the global source line 800 may be parallel to an extending direction of the stacks of memory cells 500 and the insulating stacks 600. The global bit line 700 and the global source line 800 extend along a Y direction. The global bit line 700 and the global source line 800 may comprise a suitable conductive material, such as aluminum copper alloy (AlCu alloy).

In one embodiment, the first pillar elements 910, the second pillar element 920, the third pillar elements 930 and the fourth pillar element 940 penetrate the insulating stacks 600, The first pillar elements 910, the second pillar element 920, the third pillar elements 930 and the fourth pillar element 940 extend along a longitudinal direction (such as a Z direction), The first pillar elements 910, the second pillar element 920, the third pillar elements 930 and the fourth pillar element 940 may comprise a suitable conductive material, such as tungsten (W).

In one embodiment, the local bit lines 1400 are electrically connected to bit line transistors 300 through the first pillar elements 910, and the bit line transistors 300 are electrically connected to the global bit line 700 through the second pillar element 920. According to the present embodiment, the local bit lines 1400 are connected with the first pillar elements 910, the first pillar elements 910 are connected with the bit line transistors 300, the bit line transistors 300 are connected with the second pillar element 920, and the second pillar element 920 is connected with the global bit line 700.

In one embodiment, the local source lines 1500 are electrically connected to the source line transistors 200 through the third pillar elements 930, and the source line transistors 200 are electrically connected to the global source line 800 through the fourth pillar element 940. According to the present embodiment, the local source lines 1500 are connected with the third pillar elements 930, the third pillar elements 930 are connected with the source line transistors 200, the source line transistors 200 are connected with the fourth pillar element 940, and the fourth pillar element 940 is connected with the global source line 800.

Since local bit lines 1400 and local source lines 1500 may be arranged alternately and respectively connected to bit line transistors 300 and source line transistors 200, the present application can achieve the technical effect of reducing the RC delay time of the local bit lines 1400 and the local source lines 1500.

Figure 1C:
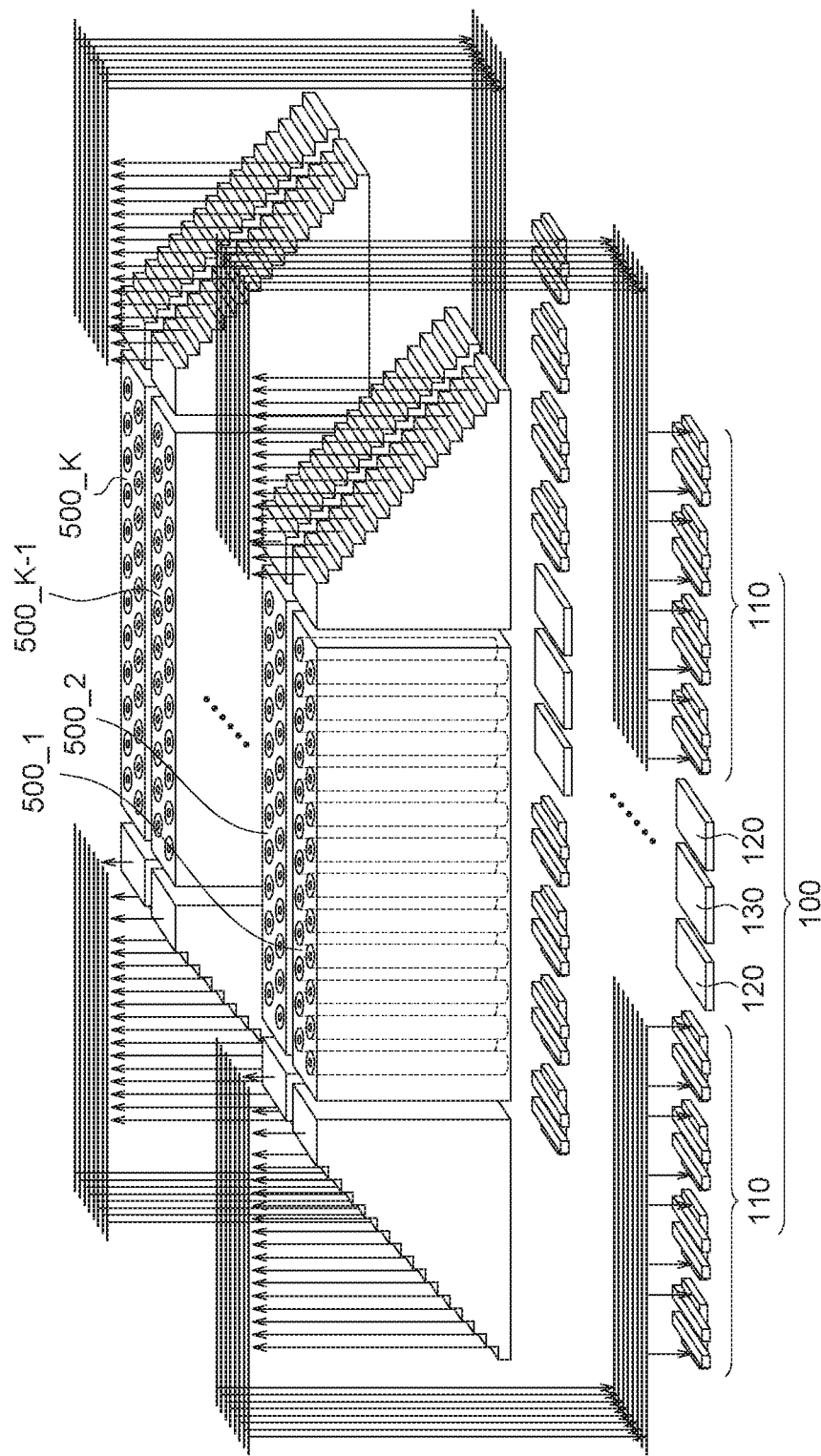
FIG. 1C illustrates a layout view of staircase decoders and stacks of memory cells of a semiconductor structure of FIG. 1A.

FIG. 1C illustrates a layout view of staircase decoders 100 and stacks of memory cells 500_1, 500_2 . . . 500_K-1, 500_K of a semiconductor structure 10 of FIG. 1A.

Referring to FIG. 1C, the semiconductor structure 10 may further comprise staircase decoders 100 and stacks of memory cells 500_1, 500_2 . . . 500_K-1, 500_K.

In one embodiment, the staircase decoders 100 are located below the stacks of memory cells 500_1, 500_2 . . . 500_K-1, 500_K, respectively. In other words, in a longitudinal direction, staircase decoders 100 may at least partially overlap the stacks of memory cells 500_1, 500_2 . . . 500_K-1, 500_K, respectively.

In one embodiment, the staircase decoder 100 comprises a local driver 110, a level shifter 120 and other circuit 130.

For instance, the local driver 110 may comprise a NMOS, a PMOS, a CMOS inverter, a diode or a BJT.

For instance, the other circuit 130 may comprise a pumping circuit, a decoding circuit or a control circuit.

Second Embodiment

Figure 2A:
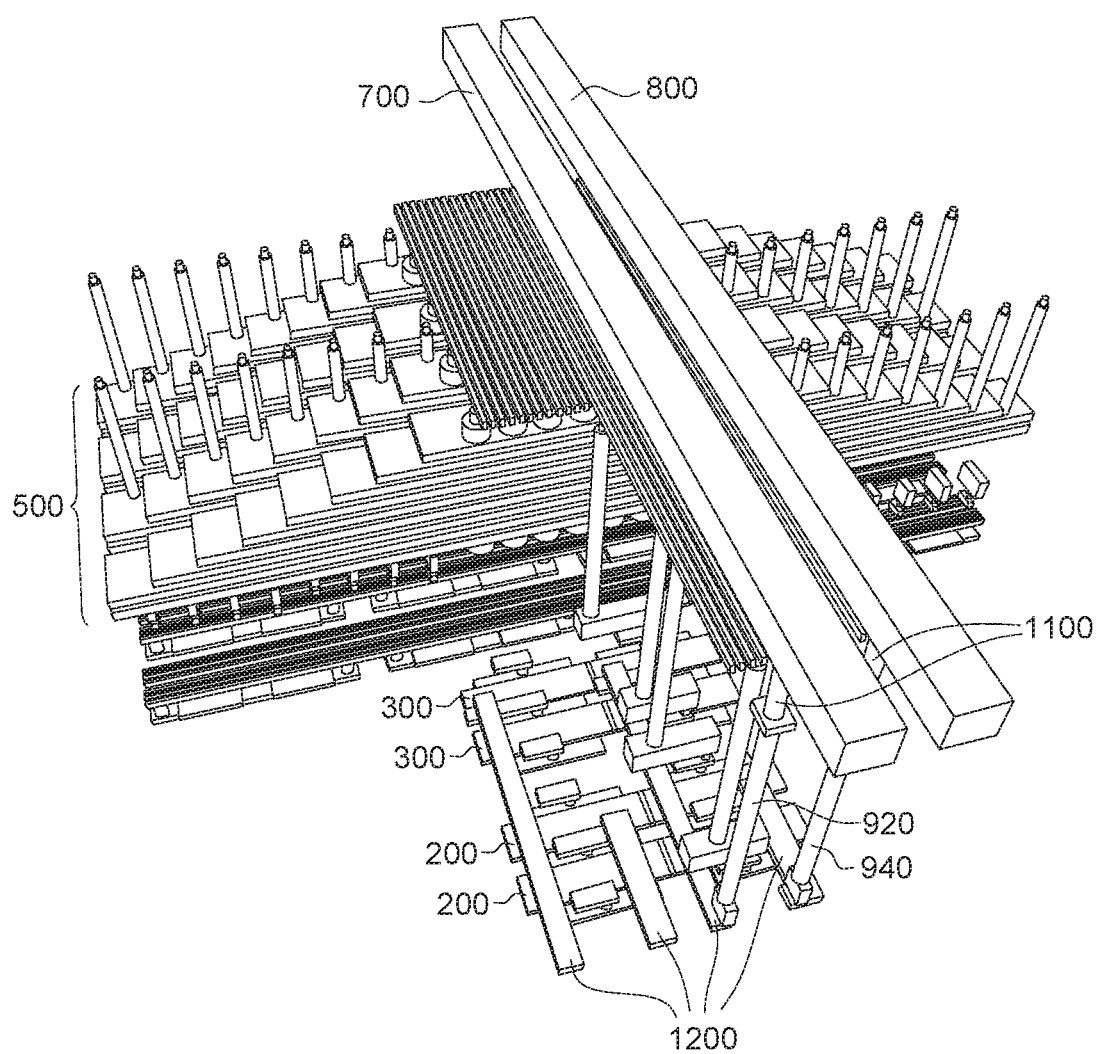
FIG. 2A illustrates a partial top view of a semiconductor structure according to a second embodiment of the present invention.
Figure 2B:
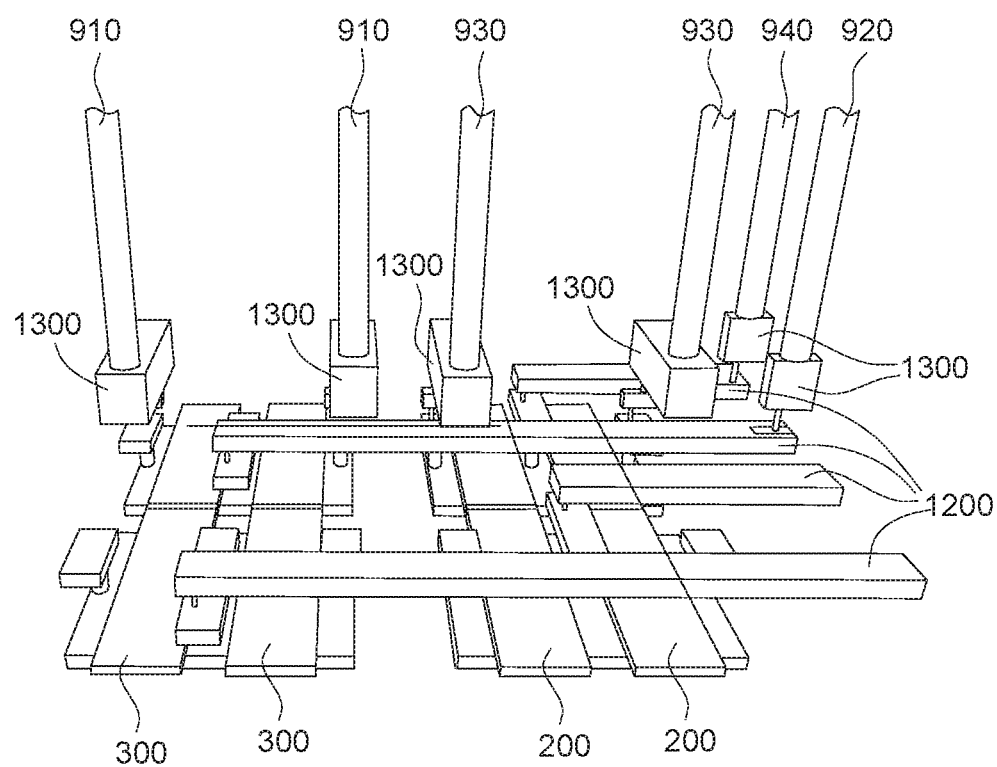
FIG. 2B illustrates a partial enlarged view of a semiconductor structure of FIG. 2A.
Figure 2C:
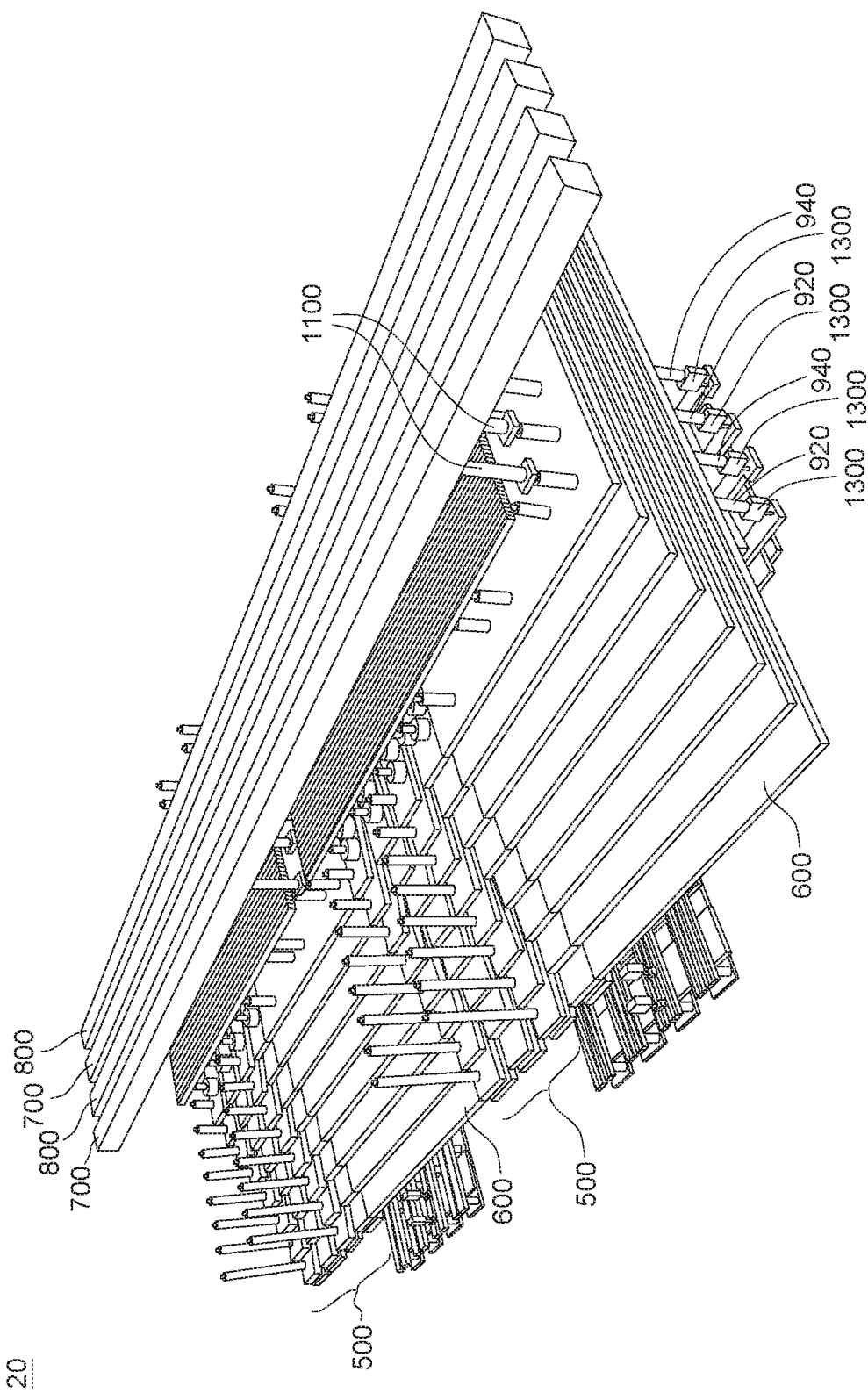
FIG. 2C illustrates a three dimensional view of a semiconductor structure of FIG. 2A.

FIG. 2A illustrates a partial top view of a semiconductor structure 20 according to a second embodiment of the present invention. FIG. 2B illustrates a partial enlarged view of a semiconductor structure 20 of FIG. 2A. FIG. 2C illustrates a three dimensional view of a semiconductor structure 20 of FIG. 2A.

Referring to FIGS. 2A, 2B and 2C together, semiconductor structure 20 comprises a CMOS structure (comprising a source line transistor 200 and a bit line transistor 300), a stack of memory cells 500, an insulating stack 600, a global bit line 700, a global source line 800, a first pillar element 910, a second pillar element 920, a third pillar element 930, a fourth pillar element 940, a via 1100, a first metal layer 1200 and a second metal layer 1300.

The semiconductor structure 20 of the second embodiment is similar to the semiconductor structure 10 of the first embodiment. The semiconductor structure 20 of the second embodiment is different from the semiconductor structure 10 of the first embodiment mainly in that the source line transistor 200 is adjacent to the bit line transistor 300.

In one embodiment, the source line transistors 200 and the bit line transistors 300 extend along a first direction, the first metal layer 1200 extends along a second direction, and the first direction is different from the second direction. In another embodiment, the first direction may be defined as a direction substantially parallel to an extending direction of the stack of memory cells 500, and the second direction may be defined as a direction substantially perpendicular to the extending direction of the stack of memory cells 500. That is, the first direction may be substantially perpendicular to the second direction.

In one embodiment, the stack of memory cells 500 extend along a first direction, the global bit line 700, the global source line 800 and the first metal layer 1200 extend along a second direction, and the first direction is different from the second direction. In another embodiment, the second direction may be defined as a direction substantially perpendicular to the extending direction of the stack of memory cells 500. That is, the first direction may be substantially perpendicular to the second direction.

In one embodiment, the first pillar elements 910, the second pillar element 920, the third pillar elements 930 and the fourth pillar element 940 extend along a longitudinal direction. The longitudinal direction may be defined as a normal direction of a top surface of the source line transistor 200. The longitudinal direction may also be defined as a normal direction of a top surface of the bit line transistor 300.

In one embodiment, the first pillar elements 910, the second pillar element 920, the third pillar elements 930 and the fourth pillar element 940 are located above the first metal layer 1200. In another embodiment, the first pillar elements 910, the second pillar element 920, the third pillar elements 930 and the fourth pillar element 940 are located above the first metal layer 1200 and the second metal layer 1300. In a further embodiment, the first pillar elements 910, the second pillar element 920, the third pillar elements 930 and the fourth pillar element 940 are located between the local bit lines 1400 and the bit line transistors 300. The first pillar elements 910, the second pillar element 920, the third pillar elements 930 and the fourth pillar element 940 are located between the local source lines 1500 and the source line transistors 200.

In one embodiment, the first metal layer 1200 is located above the source line transistors 200 and the bit line transistors 300. The first metal layer 1200 may comprise a suitable conductive material, such as tungsten ON).

In one embodiment, the second metal layer 1300 is located above the first metal layer 1200. In another embodiment, the second metal layer 1300 is located between the first metal layer 1200 and the second pillar element 920, or located between the first metal layer 1200 and the fourth pillar element 940. The second metal layer 1300 may comprise a suitable conductive material, such as tungsten (W).

In one embodiment, the via 1100 is located between the global bit line 700 and the second pillar element 920. In another embodiment, the via 1100 is located between the global source line 800 and the fourth pillar element 940. The via 1100 may comprise a suitable conductive material, such as tungsten (W).

In one embodiment, the local bit lines 1400 are electrically connected to the bit line transistors 300 through the first pillar elements 910. Namely, the first pillar elements 910 may transmit signals in local bit lines 1400 to bit line transistors 300. In another embodiment, the first pillar element 910 may directly contact one of the local bit line 1400 or the bit line transistor 300. In a further embodiment, the first pillar element 910 may directly contact the local bit line 1400 and the bit line transistor 300. In other words, the first pillar element 910 may serve as a connecting conductor between the local bit line 1400 and the bit line transistor 300, but the present invention is not limited thereto.

In one embodiment, the bit line transistors 300 are electrically connected to the global bit line 700 through the first metal layer 1200, the second metal layer 1300, the second pillar element 920 and the via 1100. Namely, the signals flowing into the bit line transistors 300 may be transmitted to the global bit line 700 through the first metal layer 1200, the second metal layer 1300, the second pillar element 920 and the via 1100 in order.

In one embodiment, the local source lines 1500 are electrically connected to the source line transistors 200 through the third pillar elements 930. Namely, the third pillar elements 930 may transmit signals in local source lines 1500 to source line transistors 200. In another embodiment, the third pillar element 930 may directly contact one of the local source line 1500 or the source line transistor 200. In a further embodiment, the third pillar element 930 may directly contact the local source line 1500 and the source line transistor 200. In other words, the third pillar element 930 may serve as a connecting conductor between the local source line 1500 and the source line transistor 200, but the present invention is not limited thereto.

In one embodiment, the source line transistors 200 are electrically connected to the global source line 800 through the first metal layer 1200, the second metal layer 1300, the fourth pillar element 940 and the via 1100. Namely, the signals flowing into the source line transistors 200 may be transmitted to the global source line 800 through the first metal layer 1200, the second metal layer 1300, the fourth pillar element 940 and the via 1100 in order.

Referring to FIG. 2C, the global bit lines 700 and global source lines 800 may be arranged alternately, but the present invention is not limited thereto.

Third Embodiment

Figure 3:
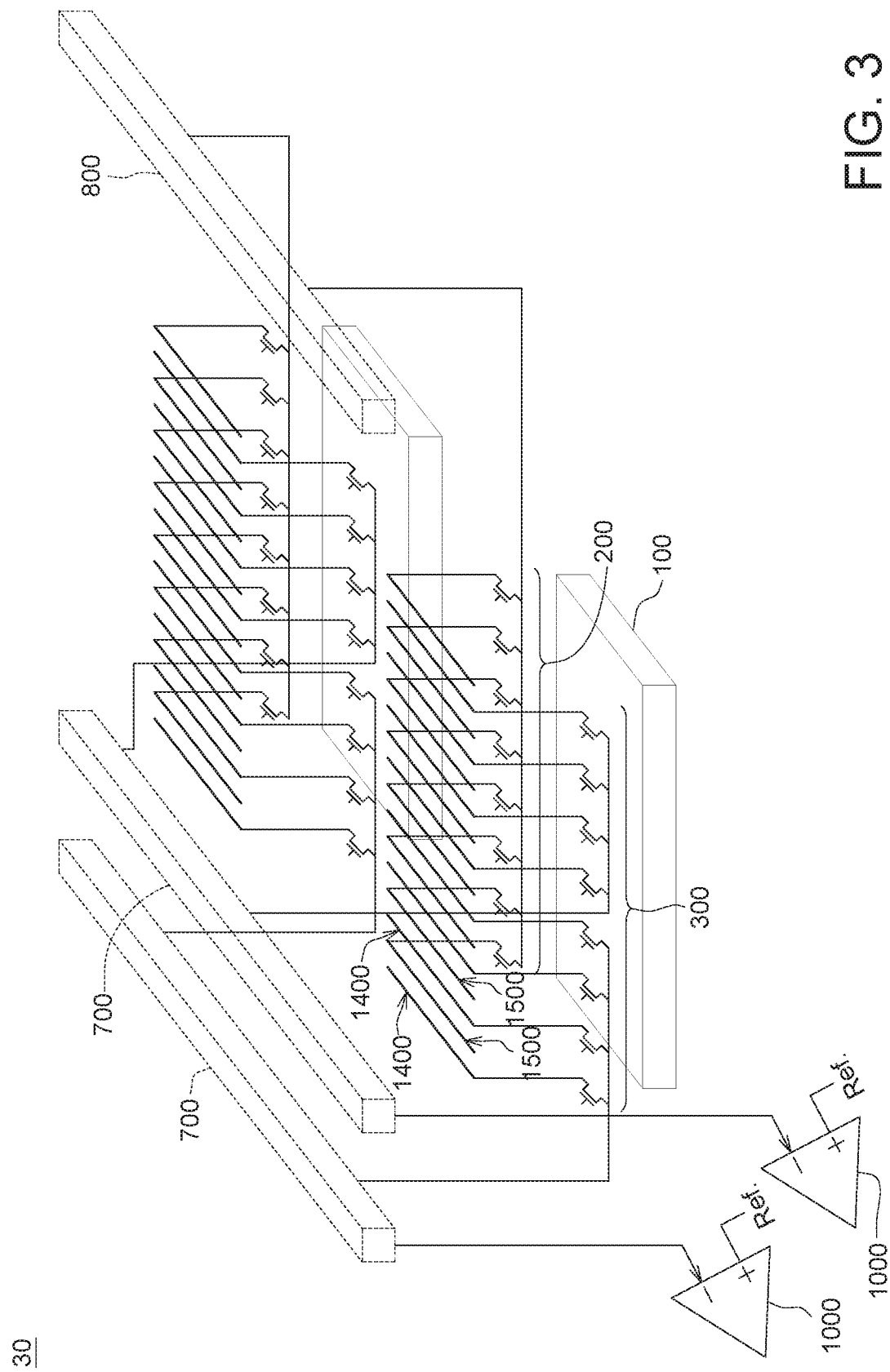
FIG. 3 illustrates a layout view of local bit lines, local source lines, global bit lines and a global source line of a semiconductor structure according to a third embodiment of the present invention.

FIG. 3 illustrates a layout view of local bit lines 1400, local source lines 1500, global bit lines 700 and a global source line 800 of a semiconductor structure 30 according to a third embodiment of the present invention.

Referring to FIG. 3, the semiconductor structure 30 comprises a local bit line 1400, a local source line 1500, a CMOS structure (comprising a source line transistor 200, a bit line transistor 300 and a staircase decoder 100), a global bit line 700, a global source line 800 and a sense amplifier 1000.

In one embodiment; the staircase decoder 100 is located below a stack of memory cells 500 (not shown). In other words, in a longitudinal direction; the staircase decoder 100 at least partially overlaps the stack of memory cells 500.

In one embodiment, the local bit lines 1400, the local source lines 1500, the global bit lines 700, the global source line 800 are located above the stack of memory cells 500 (not shown). The global bit lines 700 and the global source line 800 are located above the local bit lines 1400 and the local source lines 1500.

In one embodiment, the local source lines 1500 are electrically connected to the source line transistors 200, and the source line transistors 200 are electrically connected to the global source line 800, The local bit lines 1400 are electrically connected to the bit line transistors 300, and the bit line transistors 300 are electrically connected to the global bit lines 700, In another embodiment, a number of the local source lines 1500 electrically connected to the global source line 800 is greater than a number of the local bit lines 1400 electrically connected to the global bit line 700, For instance, the number of the local source lines 1500 electrically connected to the global source line 800 is twice the number of the local bit lines 1400 electrically connected to the global bit line 700, but the present invention is not limited thereto.

In one embodiment, the global bit lines 700 are electrically connected to the sense amplifiers 1000.

Accordingly to the present embodiment, a number of the local source lines electrically connected to the global source line is greater than a number of the local bit lines electrically connected to the global bit line, which has advantages of reducing resistance, the possibility of short circuit and the use of wiring.

Fourth Embodiment

Figure 4:
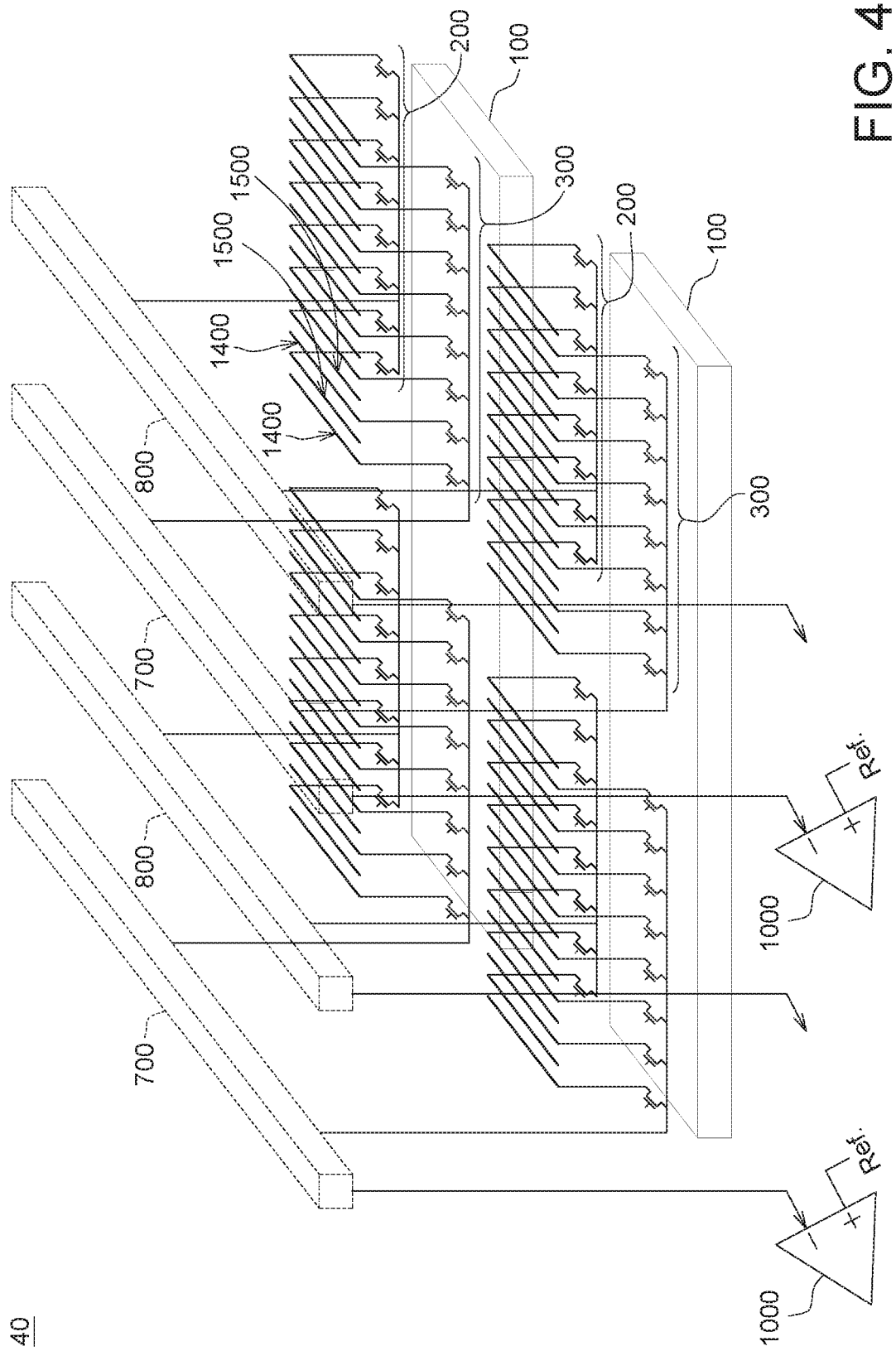
FIG. 4 illustrates a layout view of local bit lines, local source lines, global bit lines and global source lines of a semiconductor structure according to a fourth embodiment of the present invention.

FIG. 4 illustrates a layout view of local bit lines 1400, local source lines 1500, global bit lines 700 and global source lines 800 of a semiconductor structure 40 according to a fourth embodiment of the present invention.

Referring to FIG. 4, the semiconductor structure 40 comprises a local bit line 1400, a local source line 1500, a CMOS structure (comprising a source line transistor 200, a bit line transistor 300 and a staircase decoder 100), a global bit line 700, a global source line 800 and a sense amplifier 1000.

The semiconductor structure 40 of the fourth embodiment is similar to the semiconductor structure 30 of the third embodiment. The semiconductor structure 40 of the fourth embodiment is different from the semiconductor structure 30 of the third embodiment mainly in that a number of the local source lines 1500 electrically connected to the global source line 800 is identical to a number of the local bit lines 1400 electrically connected to the global bit line 700.

In one embodiment, the global source lines 800 are connected to page buffer circuits.

Accordingly to the present embodiment, a number of the local source lines electrically connected to the global source line is identical to a number of the local bit lines electrically connected to the global bit line, which can enhance the array operation flexibility and avoid the current crowding effect.

Fifth Embodiment

Figure 5:
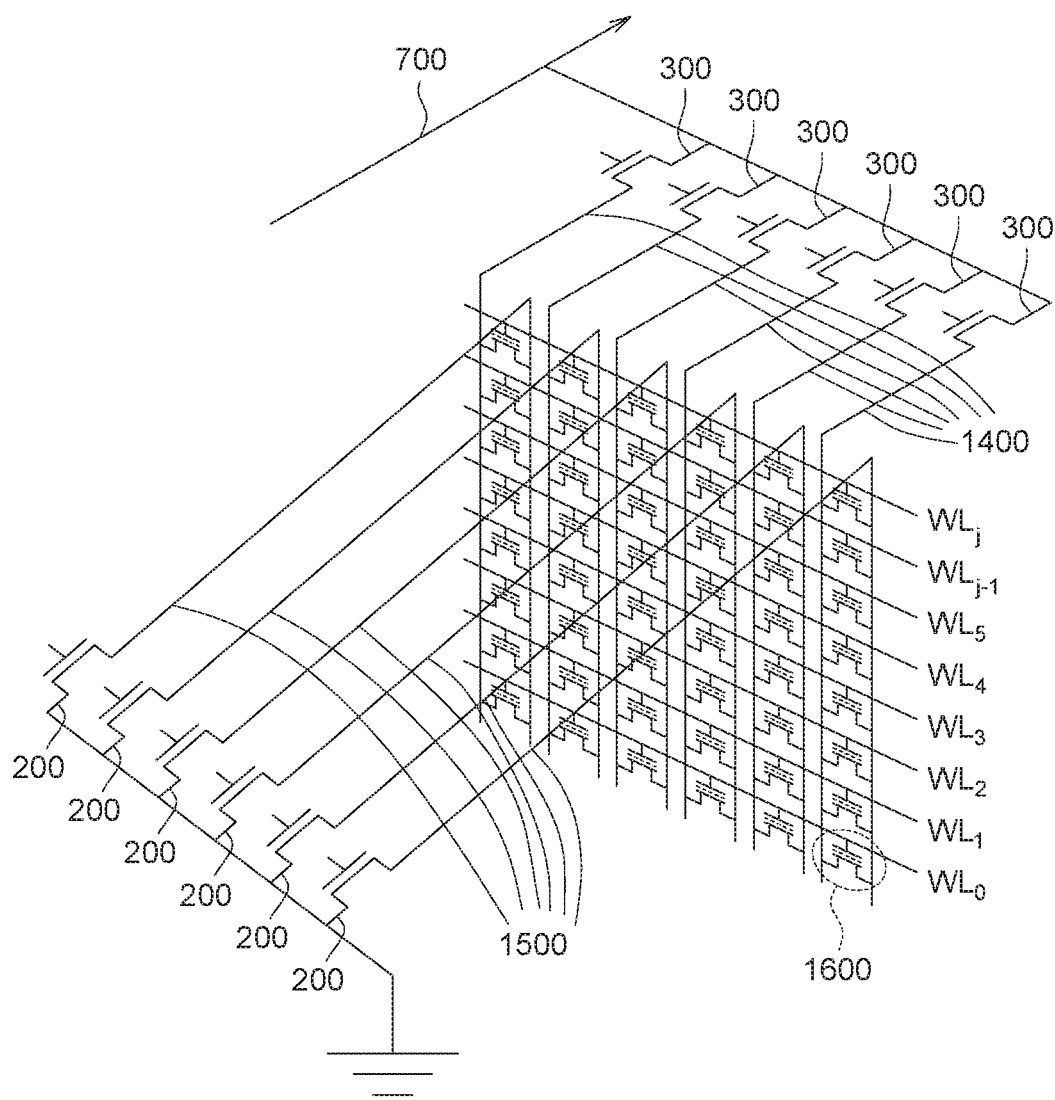
FIG. 5 illustrates a layout view of local bit lines, local source lines and a global bit line of a semiconductor structure according to a fifth embodiment of the present invention.

FIG. 5 illustrates a layout view of local bit lines 1400, local source lines 1500 and a global bit line 700 of a semiconductor structure 50 according to a fifth embodiment of the present invention.

Referring to FIG. 5, the semiconductor structure 50 comprises a CMOS structure (comprising a source line transistor 200 and a bit line transistor 300), a global bit line 700, a local bit line 1400, a local source line 1500, and a stack of memory cells 500. The stack of memory cells 500 comprises memory cell strings and word lines $WL_0$, $WL_1$, ... $WL_{j-1}$, $W_j$. Each of the cross-points of the memory cell strings and word lines $WL_0$, $WL_1$, ... $WL_{j-1}$, $WL_j$ form memory cells 1600. The local bit line 1400 and the local source line 1500 may be electrically connected to a source or a drain of the memory cell 1600, respectively.

In one embodiment, the local bit lines 1400 are electrically connected to the bit line transistors 300, respectively. The bit line transistors 300 are electrically connected to the global bit line 700.

In one embodiment, the local source lines 1500 are electrically connected to the source line transistors 200, respectively. The source line transistors 200 are grounded by local routing.

According to the above embodiments, a semiconductor structure is provided. The semiconductor structure comprises a stack of memory cells and a CMOS structure. The CMOS structure is located below the stack of memory cells. The CMOS structure comprises a source line transistor and a bit line transistor.

Compared with the comparative example in which a CMOS structure is located at one side of a stack of memory cells and not located below the stack of memory cells, the CMOS structure is below the stack of memory cells in the semiconductor structure of the present invention, which effectively reduces a size of the memory device, reduces the manufacturing cost and thereby enhances the chip performance. Furthermore, since local bit lines and local source lines may be arranged alternately and respectively connected to bit line transistors and source line transistors, the present application can achieve the technical effect of reducing the RC delay time of local bit lines and local source lines.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor structure, comprising:
a stack of memory cells comprising a staircase region,
a CMOS structure, located below the stack of memory cells, wherein the CMOS structure comprises a staircase decoder, a source line transistor and a bit line transistor,
a local source line, located above the stack of memory cells, and
a third pillar element, located between the local source line and the source line transistor, wherein the local source line is electrically connected to the source line transistor through the third pillar element, wherein, in a vertical direction, the staircase decoder at least partially overlaps the staircase region.

2. The semiconductor structure according to claim 1, wherein the source line transistor is adjacent to the bit line transistor.

3. The semiconductor structure according to claim 1, wherein the stack of memory cells does not overlap the source line transistor and the bit line transistor.

4. The semiconductor structure according to claim 1, further comprising:
a local bit line, located above the stack of memory cells, and
a first pillar element, located between the local bit line and the bit line transistor, wherein the local bit line is electrically connected to the bit line transistor through the first pillar element.

5. The semiconductor structure according to claim 4, further comprising:
an insulating stack, adjacent to the stack of memory cells, wherein the first pillar element penetrates the insulating stack, and the first pillar element transmits a signal in the local bit line to the bit line transistor.

6. The semiconductor structure according to claim 1, further comprising:
a first metal layer, located above the bit line transistor,
a second pillar element, located above the first metal layer, and
a global bit line, located above the stack of memory cells, wherein the bit line transistor is electrically connected to the global bit line through the first metal layer and the second pillar element.

7. The semiconductor structure according to claim 6, further comprising:
a second metal layer, located between the first metal layer and the second pillar element, wherein the bit line transistor is electrically connected to the global bit line through the first metal layer, the second metal layer and the second pillar element.

8. The semiconductor structure according to claim 6, further comprising:
a via, located between the global bit line and the second pillar element.

9. The semiconductor structure according to claim 6, further comprising:
a sense amplifier, wherein the global bit line is connected to the sense amplifier.

10. The semiconductor structure according to claim 6, wherein the bit line transistor extends along a first direction, the first metal layer extends along a second direction, and the first direction is different from the second direction.

11. The semiconductor structure according to claim 1, further comprising:
an insulating stack, adjacent to the stack of memory cells, wherein the third pillar element penetrates the insulating stack, and the third pillar element transmits a signal in the local source line to the source line transistor.

12. The semiconductor structure according to claim 1, further comprising:
a first metal layer, located above the source line transistor,
a fourth pillar element, located above the first metal layer, and
a global source line, located above the stack of memory cells,
wherein the source line transistor is electrically connected to the global source line through the first metal layer and the fourth pillar element.

13. The semiconductor structure according to claim 12, further comprising:
a second metal layer, located between the first metal layer and the fourth pillar element, wherein the source line transistor is electrically connected to the global source line through the first metal layer, the second metal layer and the fourth pillar element.

14. The semiconductor structure according to claim 12, further comprising:
a via, located between the global source line and the fourth pillar element.

15. The semiconductor structure according to claim 12, further comprising:
a page buffer circuit, wherein the global source line is connected to the page buffer circuit.

16. The semiconductor structure according to claim 12, wherein the source line transistor extends along a first direction, the first metal layer extends along a second direction, and the first direction is different from the second direction.

17. The semiconductor structure according to claim 1, further comprising:
a plurality of the local source lines located above the stack of memory cells, a global source line located above the stack of memory cells, wherein the plurality of the local source lines are electrically connected to a plurality of the source line transistors, and the plurality of the source line transistors are electrically connected to the global source line, a plurality of local bit lines located above the stack of memory cells, and a global bit line located above the stack of memory cells, wherein the plurality of local bit lines are electrically connected to a plurality of the bit line transistors, and the plurality of the bit line transistors are electrically connected to the global bit line, wherein a number of the plurality of the local source lines electrically connected to the global source line is greater than a number of the plurality of local bit lines electrically connected to the global bit line.

18. The semiconductor structure according to claim 1, further comprising:
a plurality of the local source lines located above the stack of memory cells,
a global source line located above the stack of memory cells, wherein the plurality of the local source lines are electrically connected to a plurality of the source line transistors, and the plurality of the source line transistors are electrically connected to the global source line,
a plurality of local bit lines located above the stack of memory cells, and
a global bit line located above the stack of memory cells, wherein the plurality of local bit lines are electrically connected to a plurality of the bit line transistors, and the plurality of the bit line transistors are electrically connected to the global bit line,
wherein a number of the plurality of the local source lines electrically connected to the global source line is identical to a number of the plurality of local bit lines electrically connected to the global bit line.

19. The semiconductor structure according to claim 1, wherein the source line transistor and the bit line transistor are disposed at two opposite sides of the stack of memory cells.

* * * * *